(12) United States Patent
Lui et al.

(10) Patent No.: US 10,056,461 B2
(45) Date of Patent: Aug. 21, 2018

(54) COMPOSITE MASKING SELF-ALIGNED TRENCH MOSFET

(71) Applicant: Alpha and Omega Semiconductor Incorporated, Sunnyvale, CA (US)

(72) Inventors: Sik Lui, Sunnyvale, CA (US); Hong Chang, Saratoga, CA (US)

(73) Assignee: ALPHA AND OMEGA SEMICONDUCTOR INCORPORATED, Sunnyvale, CA (US)

( * ) Notice: Subject to any disclaimer, the term of this patent is extended or adjusted under 35 U.S.C. 154(b) by 0 days.

(21) Appl. No.: 15/283,044

(22) Filed: Sep. 30, 2016

(65) Prior Publication Data

US 2018/0097078 A1   Apr. 5, 2018

(51) Int. Cl.
| | |
|---|---|
| *H01L 21/265* | (2006.01) |
| *H01L 21/308* | (2006.01) |
| *H01L 21/311* | (2006.01) |
| *H01L 21/768* | (2006.01) |
| *H01L 21/28* | (2006.01) |
| *H01L 29/423* | (2006.01) |
| *H01L 29/08* | (2006.01) |
| *H01L 29/10* | (2006.01) |
| *H01L 29/417* | (2006.01) |
| *H01L 29/49* | (2006.01) |
| *H01L 29/66* | (2006.01) |
| *H01L 29/78* | (2006.01) |

(52) U.S. Cl.
CPC .... *H01L 29/4236* (2013.01); *H01L 21/26513* (2013.01); *H01L 21/28035* (2013.01); *H01L 21/3081* (2013.01); *H01L 21/31144* (2013.01); *H01L 21/76877* (2013.01); *H01L 21/76897* (2013.01); *H01L 29/0847* (2013.01); *H01L 29/1095* (2013.01); *H01L 29/41766* (2013.01); *H01L 29/4916* (2013.01); *H01L 29/66613* (2013.01); *H01L 29/78* (2013.01)

(58) Field of Classification Search
None
See application file for complete search history.

(56) References Cited

U.S. PATENT DOCUMENTS

| | | |
|---|---|---|
| 6,509,233 B2 | 1/2003 | Chang et al. |
| 6,538,300 B1 | 3/2003 | Goldberger et al. |
| 6,621,143 B2 | 9/2003 | Goldberger et al. |

(Continued)

*Primary Examiner* — Jay C Chang
(74) *Attorney, Agent, or Firm* — JDI Patent; Joshua Isenberg; Robert Pullman

(57) ABSTRACT

Aspects of the present disclosure discloses a method for fabricating a trench MOSFET device comprising simultaneously forming a narrow trench and a wide trench into a semiconductor substrate using a mask to defines the narrow trench and the wide trench, forming an insulating layer over the semiconductor substrate with a first portion that fills up the narrow trench and a second portion that partially fills the wide trench, removing the second portion from the wide trench completely and leaving the narrow trench filled with the first portion, forming a gate electrode, forming a body region in a top portion of the semiconductor substrate, forming a source region in a portion of the body region, removing the first portion of nitride from the narrow trench, and forming a contact plug by filling a second conductive material in the narrow trench.

14 Claims, 10 Drawing Sheets

(56) References Cited

U.S. PATENT DOCUMENTS

| | | |
|---|---|---|
| 7,605,425 B2 | 10/2009 | Bhalla et al. |
| 7,667,264 B2 | 2/2010 | Tai et al. |
| 7,767,526 B1 | 8/2010 | Lee et al. |
| 7,800,169 B2 | 9/2010 | Bhalla et al. |
| 7,879,676 B2 | 2/2011 | Lee et al. |
| 8,004,063 B2 | 8/2011 | Goldberger et al. |
| 8,187,939 B2 | 5/2012 | Tai et al. |
| 8,193,580 B2 | 6/2012 | Chen et al. |
| 8,236,651 B2 | 8/2012 | Chen et al. |
| 8,247,329 B2 | 8/2012 | Yilmaz et al. |
| 8,476,676 B2 | 7/2013 | Chang et al. |
| 8,669,613 B2 | 3/2014 | Lui et al. |
| 8,759,908 B2 | 6/2014 | Lui et al. |
| 8,828,857 B2 | 9/2014 | Lui et al. |
| 8,829,603 B2 | 9/2014 | Lui et al. |
| 8,933,506 B2 | 1/2015 | Bobde et al. |
| 8,946,816 B2 | 2/2015 | Bobde et al. |
| 8,956,940 B2 | 2/2015 | Lui et al. |
| 8,980,716 B2 | 3/2015 | Lui et al. |
| 8,994,101 B2 | 3/2015 | Chang et al. |
| 9,000,514 B2 | 4/2015 | Lee et al. |
| 9,136,060 B2 | 9/2015 | Goldberger et al. |
| 9,136,377 B2 | 9/2015 | Lee et al. |
| 9,136,380 B2 | 9/2015 | Yilmaz et al. |
| 9,171,917 B2 | 10/2015 | Bobde et al. |
| 9,190,478 B2 | 11/2015 | Calafut et al. |
| 9,190,512 B2 | 11/2015 | Lee et al. |
| 9,214,545 B2 | 12/2015 | Tai et al. |
| 9,230,957 B2 | 1/2016 | Lui et al. |
| 9,246,347 B2 | 1/2016 | Lui et al. |
| 9,269,805 B2 | 2/2016 | Lui |
| 9,281,368 B1 | 3/2016 | Lee et al. |
| 9,324,858 B2 | 4/2016 | Bhalla et al. |
| 9,356,022 B2 | 5/2016 | Lee et al. |
| 9,356,132 B2 | 5/2016 | Su et al. |
| 9,443,928 B2 | 9/2016 | Lui et al. |
| 9,450,088 B2 | 9/2016 | Lee et al. |
| 9,484,452 B2 | 11/2016 | Bobde et al. |
| 9,484,453 B2 | 11/2016 | Yilmaz et al. |
| 9,502,503 B2 | 11/2016 | Yilmaz et al. |
| 9,502,554 B2 | 11/2016 | Bobde et al. |
| 2005/0280133 A1 | 12/2005 | Luo et al. |
| 2006/0145247 A1 | 7/2006 | Zundel et al. |
| 2007/0173015 A1 | 7/2007 | Im |
| 2008/0157194 A1 | 7/2008 | Lee et al. |
| 2009/0020810 A1 | 1/2009 | Marchant |
| 2009/0065814 A1 | 3/2009 | Bhalla et al. |
| 2011/0049580 A1 | 3/2011 | Lui et al. |
| 2011/0233667 A1* | 9/2011 | Tai .................. H01L 29/407 257/334 |
| 2013/0224919 A1 | 8/2013 | Ding et al. |
| 2014/0332844 A1 | 11/2014 | Ding et al. |
| 2015/0060936 A1 | 3/2015 | Ding et al. |
| 2015/0115356 A1* | 4/2015 | Brandl ............... H01L 21/265 257/334 |
| 2015/0311295 A1 | 10/2015 | Lee et al. |
| 2016/0035742 A1* | 2/2016 | Kanakamedala . H01L 27/11582 438/264 |
| 2016/0329426 A1 | 11/2016 | Lee et al. |

\* cited by examiner

COMPOSITE MASKING SELF-ALIGNED TRENCH MOSFET

FIELD OF THE DISCLOSURE

This disclosure relates to MOSFET devices, and more specifically, to a high density trench MOSFET device and a method for fabricating the same.

BACKGROUND OF INVENTION

Field Effect Transistors (FETs) are semiconductor transistor devices in which a voltage applied to an electrically insulated gate controls flow of current between source and drain. One example of a FET is a metal oxide semiconductor FET (MOSFET), in which a gate electrode is isolated from a semiconducting body region by an oxide insulator. Generally, MOSFETs may have a planar gate structure or a trench gate structure. A MOSFET device that includes a trench gate structure offers important advantages over a planar transistor for high current, low voltage switching applications. A trench gate of a MOSFET device usually includes a trench extending from the source to the drain and having sidewalls and a floor that are each lined with a layer of thermally grown silicon dioxide. The lined trench may be filled with doped polysilicon. The structure of the trench gate allows less constricted current flow, and consequently, provides lower values of specific on-resistance. Another feature making the trench MOSFETs attractive is that the current flows vertically through the MOSFET channel extending along the vertical sidewalls of the trench from the bottom of the source across the body of the transistor to the drain below. This makes possible a smaller cell pitch and a higher cell density. One issue of increasing cell density by fabricating the transistors closer together is the alignment tolerance. The alignment tolerance is the excess amount needed to compensate for variations in the alignment. The alignment tolerance of the current lithographic processing lies in the range of 300 Å-500 Å or 30 nm-50 nm.

In addition, a high density trench MOSFET device usually includes a contact trench for making contact to source and body regions. Conventional processes for manufacturing of the high density trench MOSFET devices have used two independent masks for making gate trenches and contact trenches. Specifically, a gate trench mask is used to make a vertical gate trench. In a separate step, a trench contact mask is used to make a contact trench on a same substrate after the gate trench has been formed. However, a mask overlay issue occurs when the two masks are used to form a vertical MOSFET structure because a well-controlled spacing between the gate trench and nearby contact trench is required for high density MOSFET devices, which have increasingly smaller dimensions.

It is within this context that embodiments of the present invention arise.

BRIEF DESCRIPTION OF THE DRAWINGS

Objects and advantages of aspects of the present disclosure will become apparent upon reading the following detailed description and upon reference to the accompanying drawings in which.

DESCRIPTION OF THE SPECIFIC EMBODIMENTS

Several methods based on self-alignment processes have been proposed to solve mask overlay issue. One proposed method involves using various constructs of alternating oxide and nitride blocking planar or sidewall spacers to create a contact trench that is self-aligned to the gate trench. Another proposed method using one mask to define the gate and contact trenches protects the contact trench with resist during the etching processing of the gate trench. In order for the resist to fill the contact trench and to avoid getting into the gate trench, the gate and contact trenches cannot be placed too close, and the pitch between the gate and contact trench may be at least two alignment tolerances. The cell pitch in this method is thus limited by alignment tolerance between the contact trench and the gate trench.

Aspects of the present disclosure present a process that uses a single mask to define both gate and contact trenches. In addition, aspects of the present disclosure allow for a pitch between contact and gate trenches limited only by the capabilities of the photolithography tools. An exemplary fabrication process according to an embodiment of the present disclosure is shown in FIGS. 1A-1T.

Figure 1A:
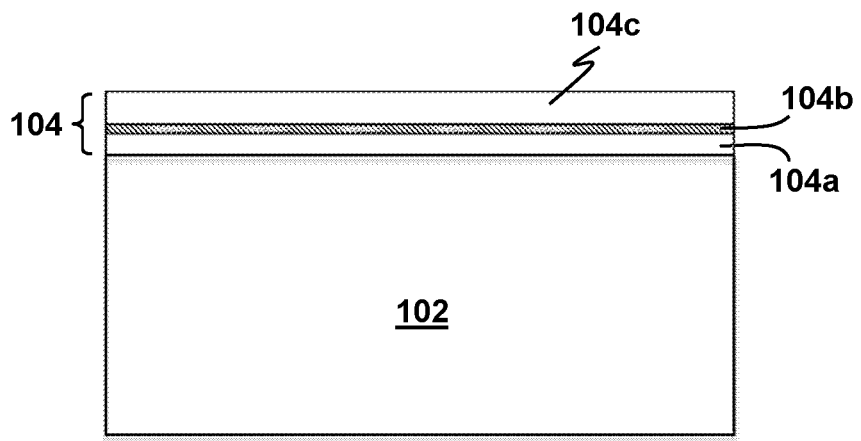
FIGS. 1A-1T are cross-sectional views illustrating a process of making gate trench and contact trench of a MOSFET device according to an embodiment of present disclosure.
Figure 1B:
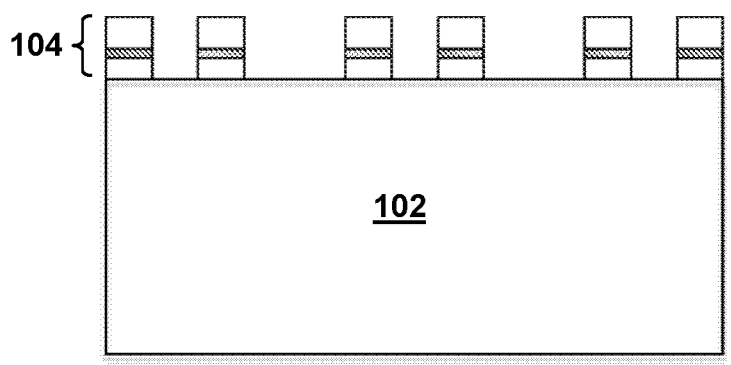
Figure 1C:
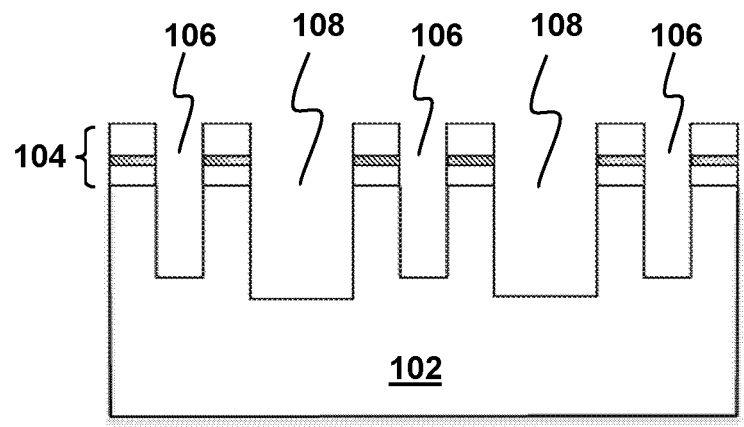
Figure 1D:
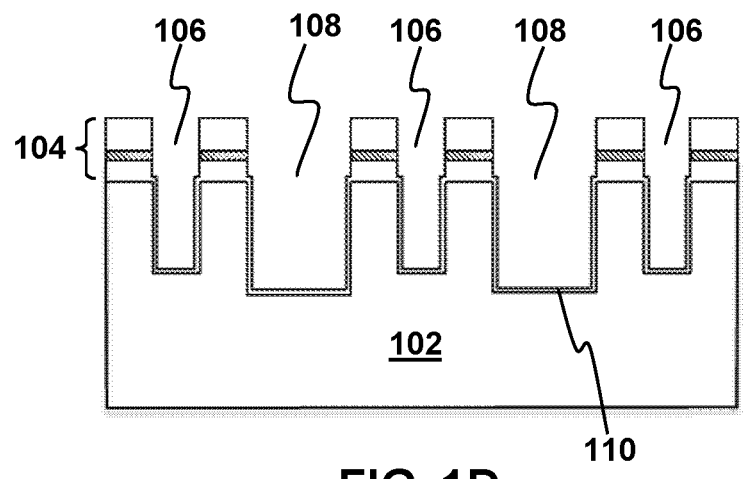

As shown in FIG. 1A, the process uses a semiconductor substrate 102 as a starting material. In some embodiments, the substrate 102 can be an N-type silicon wafer with an N-type epi layer grown on it for an N-channel device or a P-type silicon wafer with a P-type epi layer grown in it for a P-channel device. A hard mask 104 is formed on a surface of the semiconductor substrate 102 using known techniques. In some embodiments, the hard mask 104 can be an oxide-nitride-oxide (ONO) layer. More generally, the hard mask 104 includes alternating layers of two different insulator materials that are each resistant to an etch process that etches the other. The ONO layer 104 comprises from bottom to top: a bottom oxide layer 104a, a nitride layer 104b and a top oxide layer 104c. A photoresist (not shown) is then applied on the ONO layer 104 and patterned to define both the contact and gate trenches. The patterned photoresist includes openings at locations of the contact trenches and gate trenches. As shown in FIG. 1B, an ONO etch is performed to etch away portions of the ONO layer 104 that are exposed to an enchant through openings in the photoresist. After the photoresist is removed, the remaining portions of the ONO layer 104 act as a mask and the uncovered portions of the underlying semiconductor substrate 102 are etched down to simultaneously form the contact trenches 106 and gate trenches 108 as shown in FIG. 1C. It is understood by those skilled in the art of semiconductor fabrication, a wider trench opening results in a deeper trench than a narrower trench opening due to the nature of the silicon etch loading factor. Since gate trench openings are wider than contact openings, the resulting gate trenches 108 are etched deeper than the contact trenches 106 as shown in FIG. 1C. Next, a screen oxide layer 110, an insulating layer, is grown along the inner surface of the trenches as shown in FIG. 1D. The screen oxide layer 110 acts as an etch stop for an isotropic nitride etch in the subsequent process.

Figure 1E:
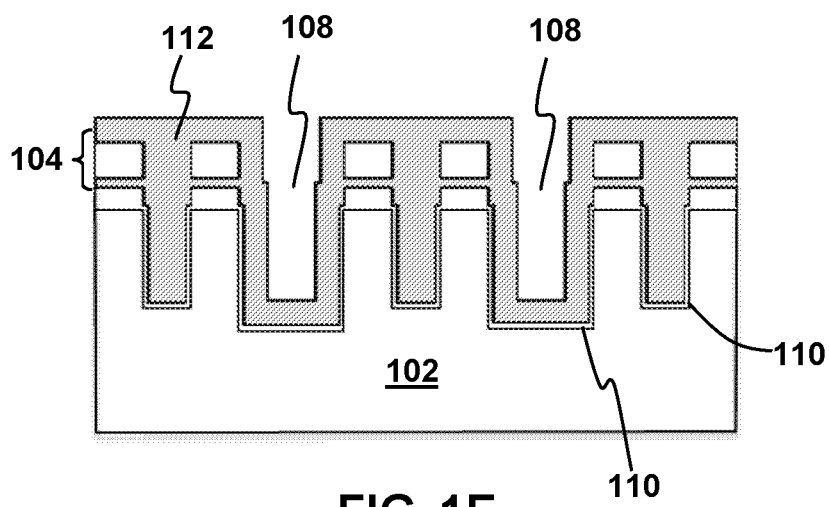
Figure 1F:
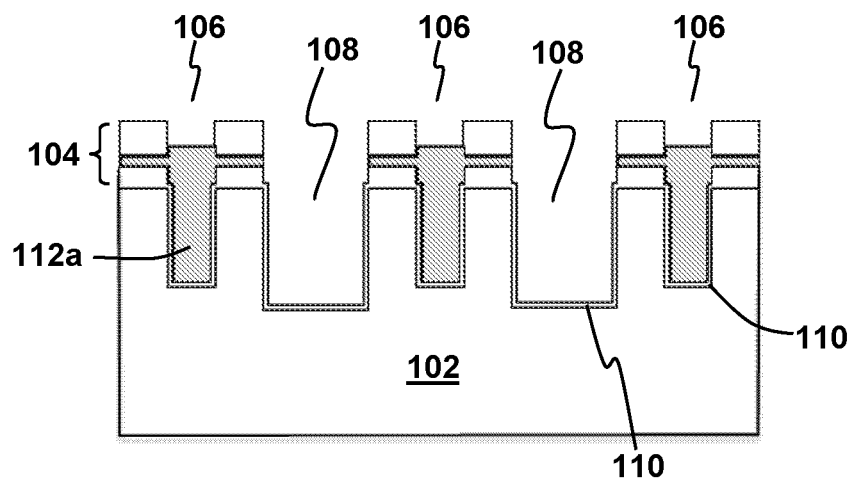
Figure 1G:
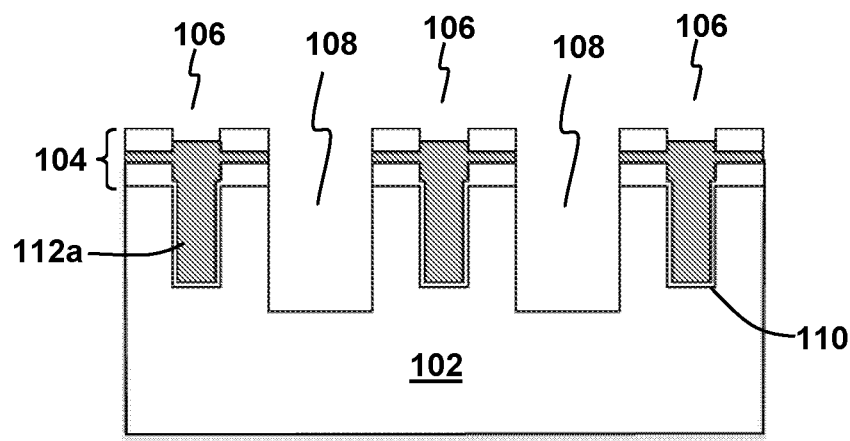
Figure 1H:
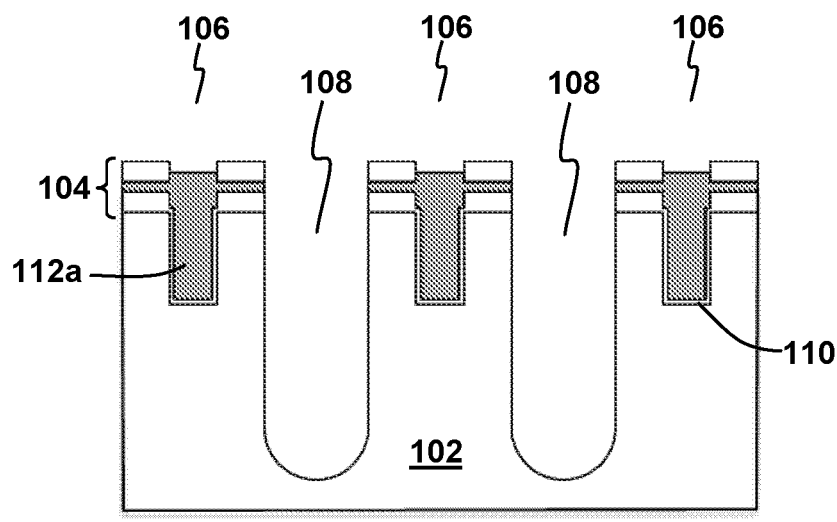

Next, a nitride layer 112 is deposited as shown in FIG. 1E where the narrow trenches (i.e., contact trenches 106) are completely filled up, but not the wide trenches (i.e., gate trenches 108). Depending on the width of the contact trench, the thickness of the nitride layer 112 has to be thick enough to fill the contact trench but not completely fill the gate trenches 108. In some embodiments, the thickness of the nitride layer 111 can be approximately 500 Å to 2000 Å for a contact trench with a depth of 0.1 µm to 0.5 µm. After nitride deposition, an isotropic etch is carried out, as shown in in FIG. 1F to remove all nitride from the wide trenches (i.e., gate trenches 108) but leaves the narrow trenches (i.e., contact trenches 106) filled with nitride 112a. The screen oxide layer 110 acts as an etch stop for the nitride. Thereafter, the screen oxide layer 110 is removed in FIG. 1G. An etch on the gate trenches are conducted in FIG. 1H. The gate trenches 108 are etched deeper into the semiconductor substrate 102 while contact trenches 106 are protected from the gate trench etch with the nitride 112a in the contact trenches 106. Again, although the foregoing example involves an oxide layer 110 and nitride material 112a, those skilled in the art will appreciate that what matters is that one insulating layer 110 is resistant to an etch process that etches the other insulating layer 112 and vice versa.

Figure 1I:
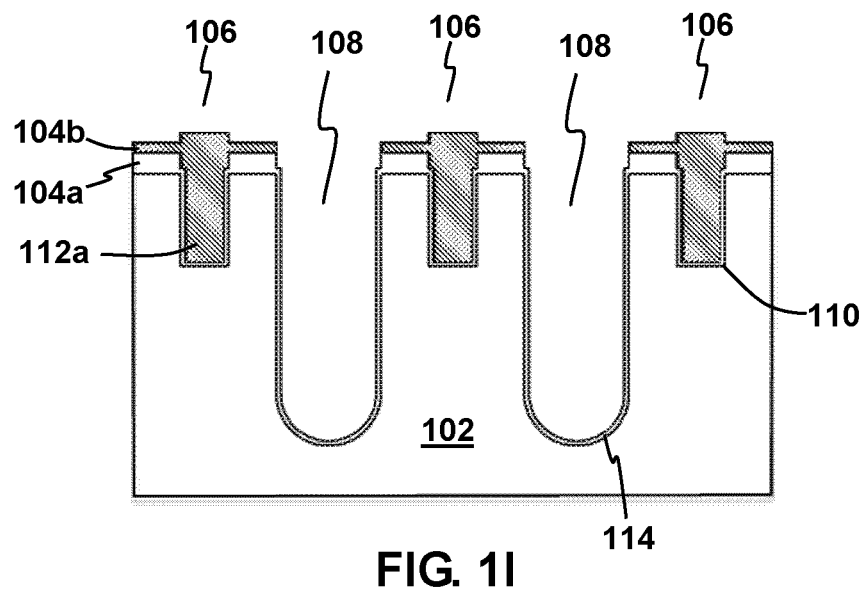
Figure 1J:
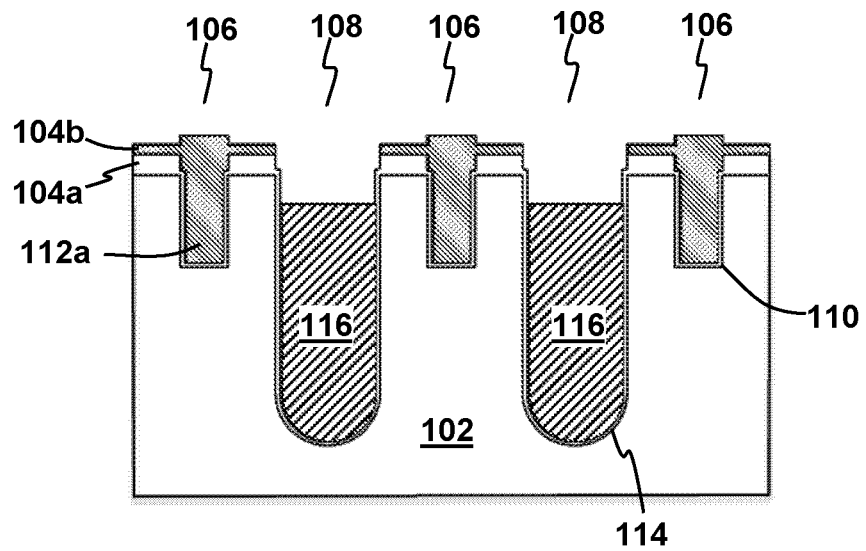

Next, a sacrificial oxide layer (not shown) may be grown and then removed to improve the silicon surface. A gate oxide layer 114 is then formed on the sidewalls and the bottoms of trenches 108 as shown in FIG. 1I. A conductive material is deposited to fill in the trenches. In some embodiments, the conductive material can be in-situ doped or undoped polysilicon. The thickness of the conductive material is such that it will completely fill up the gate trenches 108. The conductive material is then etched back forming the gate poly structures 116 as shown in FIG. 1J. In some embodiments, the surface of the gate poly structure 116 can be recessed approximately 0.05 µm to 0.2 µm below the top of the semiconductor substrate 102.

Figure 1K:
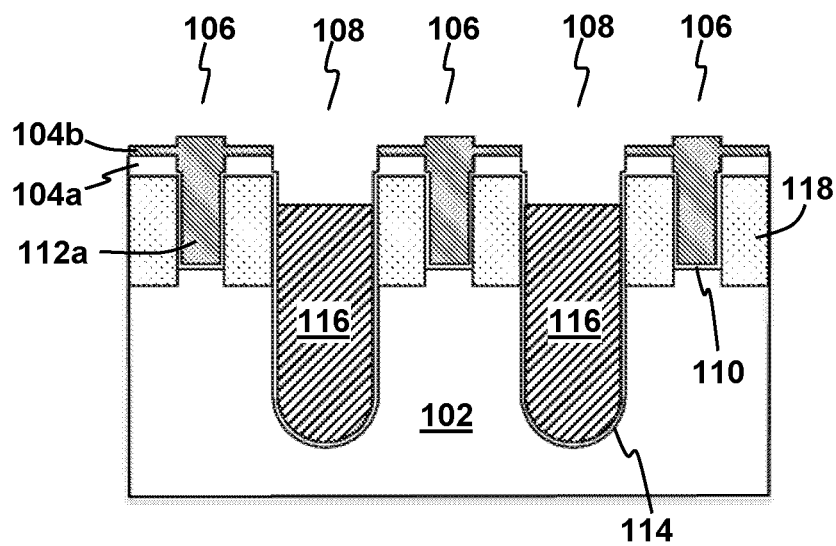
Figure 1L:
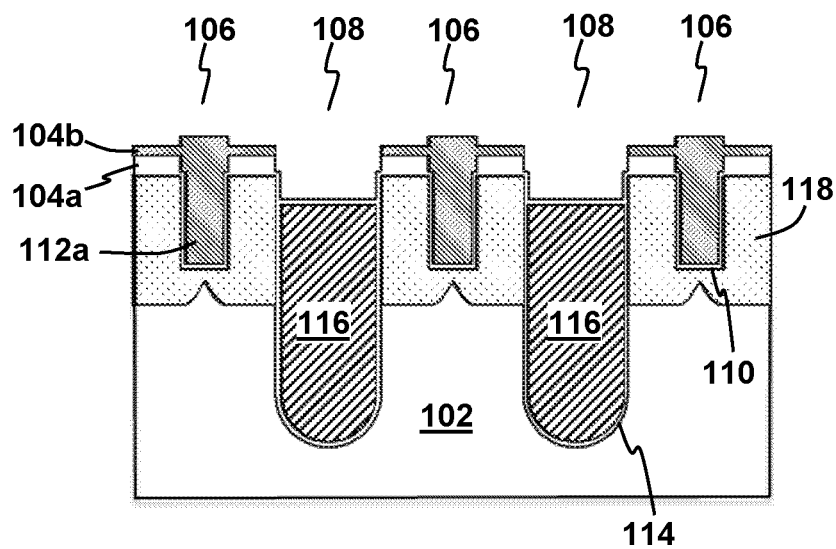

Body implant and body diffusion take place as shown in in FIG. 1K and FIG. 1L, respectively. A body mask (not shown) is applied for body implantation. In FIG. 1K, dopants are then implanted into the top portions of the semiconductor substrate 102. The dopant ions are of the opposite conductivity type to the doping of the substrate 102. In some embodiments, the dopant ions can be Boron ions for an N-channel device. In some embodiments, Phosphorous or Arsenic ions can be used for P-channel devices. Heat is then applied to activate dopant atoms and drive dopant diffusion to form a body region 118 as shown in FIG. 1L.

Figure 1M:
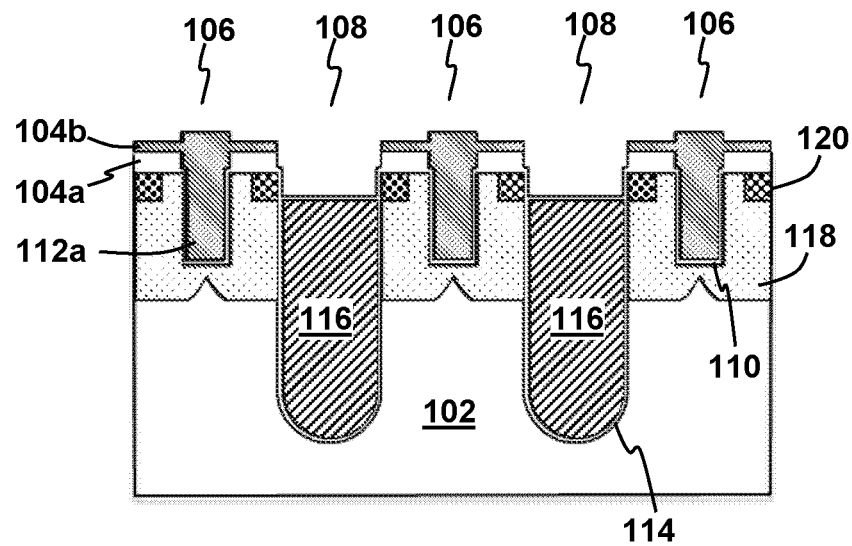
Figure 1N:
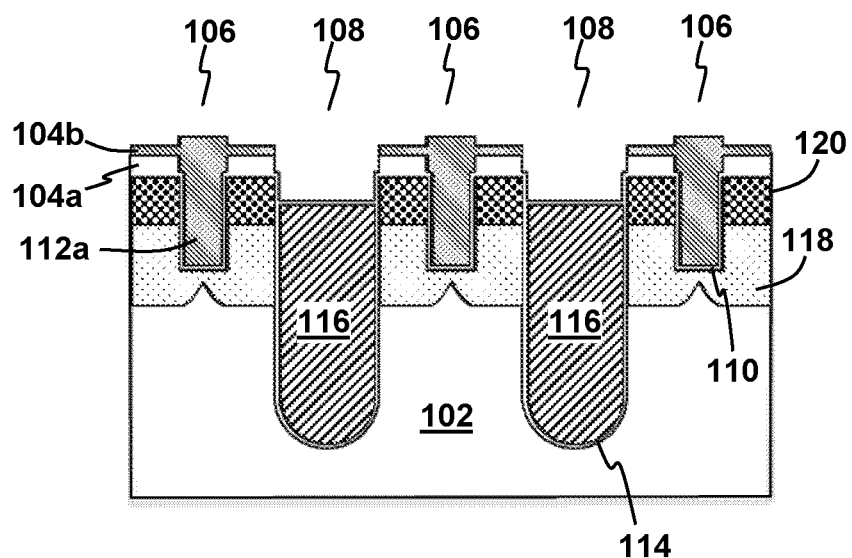

Next, source implant and source diffusion take place as shown in FIG. 1M and FIG. 1N, respectively. In source implant depicted in FIG. 1M, a large tilt angle implant may be performed for source implantation with a source mask (not shown). In some embodiments, Arsenic ions can be implanted to form the source regions for an N-channel device. Alternatively, Boron ions can be implanted to form the source region for a P-channel device. Standard diffusion processes may then be carried out to form the source regions 120 within body regions 118 as shown in FIG. 1N.

Figure 1O:
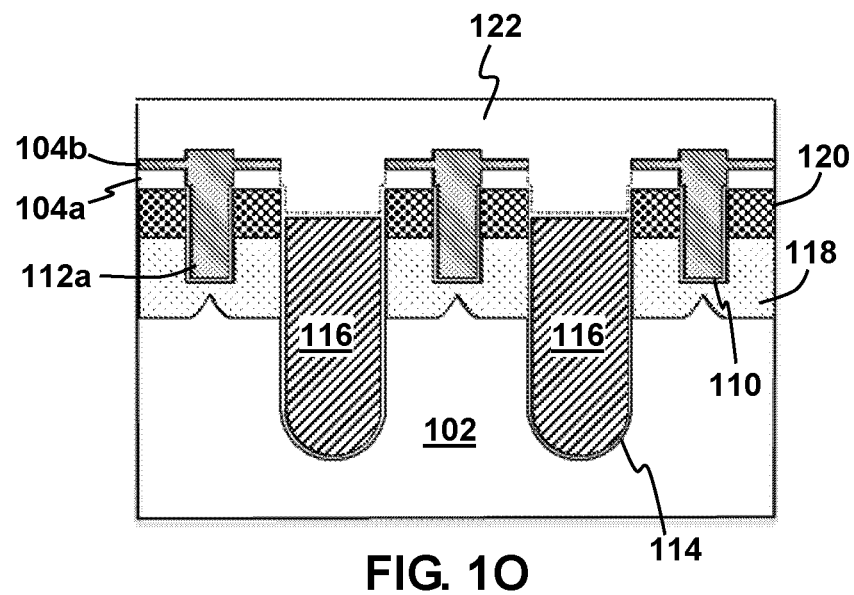

A dielectric layer 122, such as an oxide, can be deposited over the semiconductor substrate 102 as shown in FIG. 1O. In some embodiments, the dielectric layer 122 is formed by a low temperature oxide process and a layer of Borophosphorosilicate Glass (BPSG).

Figure 1P:
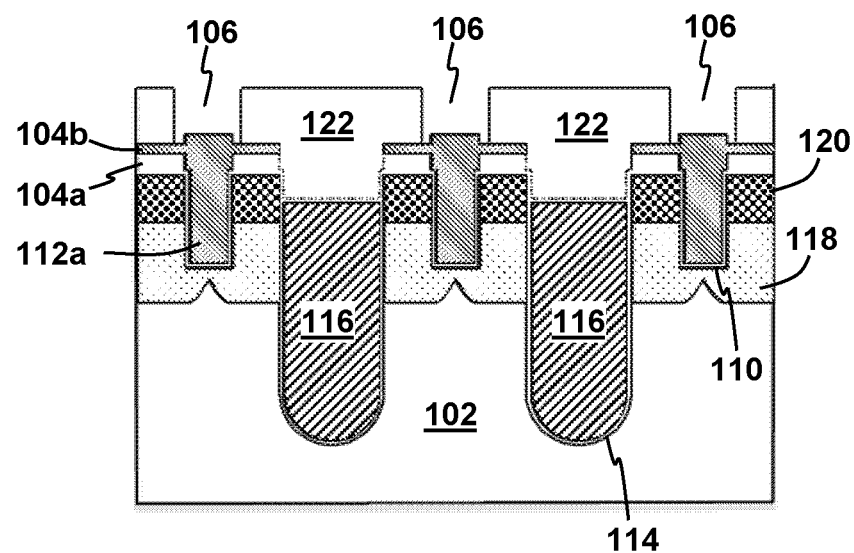
Figure 1Q:
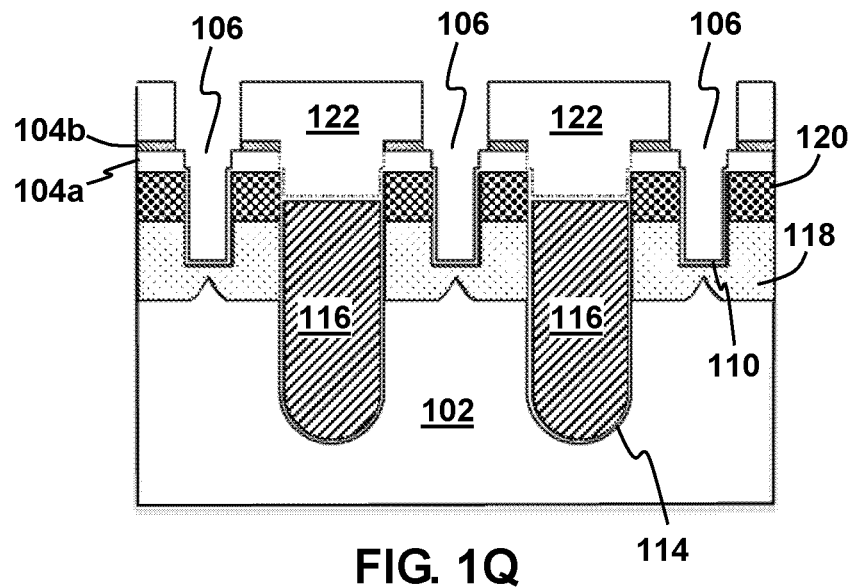
Figure 1R:
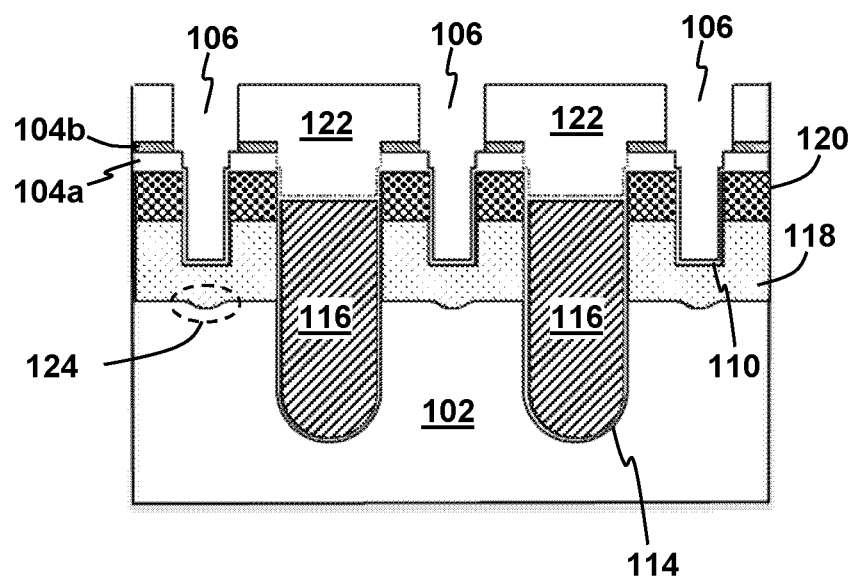
Figure 1S:
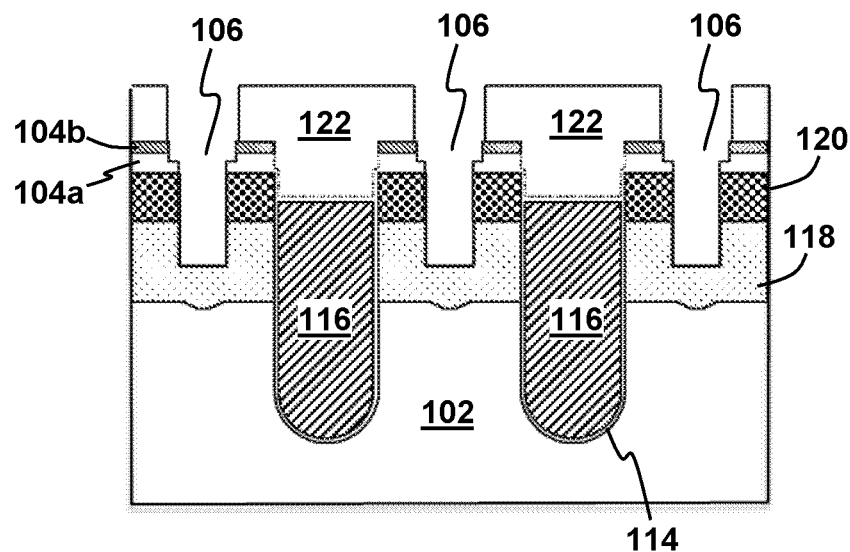
Figure 1T:
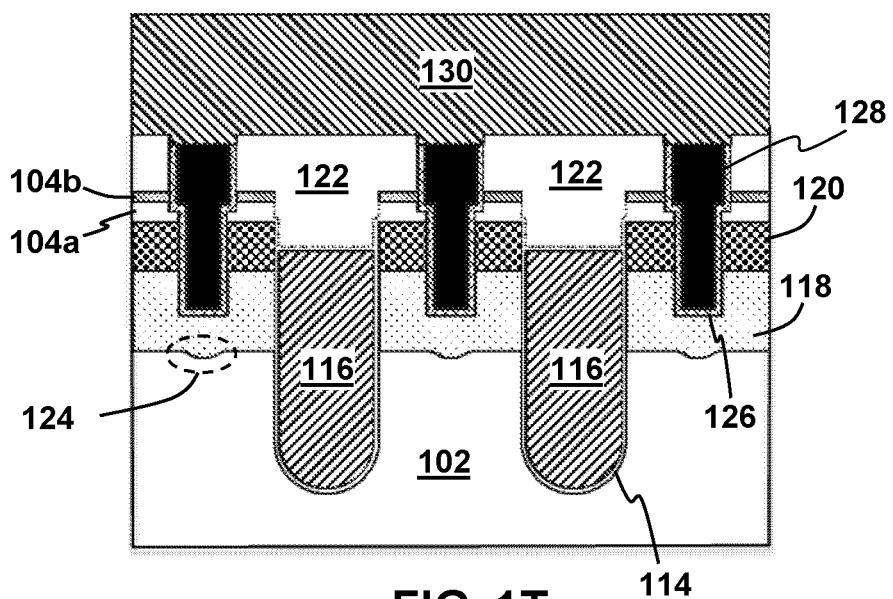

A contact photoresist (not shown) may be applied on the dielectric layer 122 and pattern with openings that uncover the contact trenches 106. The uncovered portions of the dielectric layer 122 is then etched back as shown in FIG. 1P, and the etching stops at the surface of the nitride 112a which acts as an etch stop. In FIG. 1Q, the nitride 112a in the contact trenches is then removed. Standard processes of contact implant is followed to form contact regions 124 proximate to the bottoms of the contact trenches 106 shown in FIG. 1R so that the contact regions 124 become more heavily doped. A subsequent etch may be performed to remove the screen oxide layer 110 along the inner surface of the contact trenches 106 as shown in FIG. 1S.

Next, as depicted in FIG. 1T, a barrier metal 126 is first lined with the inner surface of the contact trenches 106. In some embodiments, the barrier metal 126 may be Titanium (Ti) or Titanium Nitride (TiN). A conductive material 128, such as Tungsten (W), may then be blanket deposited in the contact trenches 106 followed by an etch back up to the surface of the dielectric layer 122 to form a conductive plug 128 as shown in FIG. 1T. Finally, a metal layer 130 is deposited on top of the semiconductor substrate 102 as in FIG. 1T. In some embodiments, the metal layer 130 may be Aluminum (Al) or Aluminum Copper (AlCu).

Aspects of the present disclosure uses a single mask to simultaneously form a contact trench 106 and a gate trench 108 into a semiconductor substrate as shown in FIGS. 1B and 1C. In addition, aspects of the present disclosure eliminate the need for additional protection of the contact trench 106 during additional gate trench etch because the narrower contact trench 106 remains filled with a dielectric material (nitride 112a) while the dielectric material is removed from the gate trench 108 with an isotropic etch back in FIGS. 1E and 1F. Accordingly, aspects of the present disclosure permits a smaller pitch between the contact trench and the gate trench limited only by the resolution of photolithography, and allows for making high density MOSFET devices. The resolution of the current photolithographic technique is in the range of 5 nm to 20 nm.

While the above is a complete description of the preferred embodiments of the present invention, it is possible to use various alternatives, modifications, and equivalents. Therefore, the scope of the present invention should be determined not with reference to the above description but should, instead be determined with reference to the appended claims, along with their full scope of equivalents. Any feature, whether preferred or not, may be combined with any other feature, whether preferred or not. In the claims that follow, the indefinite article "A", or "An" refers to a quantity of one or more of the item following the article, except where expressly stated otherwise. The appended claims are not to be interpreted as including means-plus-function limitations, unless such a limitation is explicitly recited in a given claim using the phrase "means for." Any element in a claim that does not explicitly state "means for" performing a specified function, is not to be interpreted as a "means" or "step" clause as specified in 35 USC § 112, ¶6.

What is claimed is:

1. A method for fabricating a trench metal oxide semiconductor field effect transistor (MOSFET) device, comprising:
   simultaneously forming a first trench and a second trench into a semiconductor substrate using a mask, wherein the mask defines the first trench and the second trench, wherein the second trench is wider than the first trench;
   forming a first insulator layer over the semiconductor substrate, wherein the first insulator layer has a first portion that fills up the first trench and a second portion that partially fills the second trench;
   removing the second portion of the first insulator layer from the second trench completely and leaving the first trench filled with the first portion of first insulator layer;
   forming an insulated gate electrode in the second trench by etching the second trench to a predetermined depth while the first trench is protected by the first portion of the first insulator layer from etching and filling a conductive material in the second trench;

forming a body region in a top portion of the semiconductor substrate;

forming a source region in a portion of the body region;

removing the first portion of the first insulator layer from the first trench; and forming a contact plug by filling the first trench with electrically conductive material, wherein the first trench is a contact trench for making contact to the source and body regions and the second trench is a gate trench.

2. The method of claim 1, wherein simultaneously forming the first trench and the second trench into the semiconductor substrate using the mask comprises:

forming a mask layer on a surface of the semiconductor substrate;

patterning the mask layer to form the mask with first and second openings corresponding to the first and second trenches; and simultaneously etching the first trench and the second trench into the semiconductor substrate through the first and second openings in the mask.

3. The method of claim 2, wherein the mask layer is an oxide-nitride-oxide (ONO) layer.

4. The method of claim 1, further comprising forming a second insulator layer along an inner surface of the first trench and the second trench prior to forming the first insulator layer.

5. The method of claim 4, wherein the first insulator layer includes a nitride and the second insulator layer includes an oxide.

6. The method of claim 1, wherein completely removing the second portion of first insulator layer from the second trench and leaving the first trench filled with the first portion of first insulator layer includes isotropically etching the first insulator layer.

7. The method of claim 1, wherein the gate electrode includes polysilicon.

8. The method of claim 1, further comprising forming a gate insulating layer along an inner surface of the second trench prior to filling the second trench with the conductive material.

9. The method of claim 1, wherein removing the first portion of the first insulator layer from the first trench includes:

forming a second insulator layer over the first portion of first insulator layer and the gate electrode;

etching the second insulator layer through openings in a contact mask;

etching the first portion of the first insulator layer from the first trench; and implanting dopants to form a contact region proximate to a bottom portion of the first trench.

10. The method of claim 9, further comprising forming a metal layer over the contact plug and remaining portions of the second insulator, wherein the metal layer is in electrical contact with the contact plug.

11. The method of claim 10, wherein the metal layer is Aluminum (Al) or Aluminum Copper (AlCu) or AlSi or AlSiCu.

12. The method of claim 1, wherein forming the contact plug includes:

lining an inner surface of the first trench with a barrier metal;

filling a remaining portion of the first trench with the electrically conductive material; and etching back the electrically conductive material.

13. The method of claim 12, wherein the barrier metal is Titanium (Ti) or Titanium Nitride (TiN).

14. The method of claim 12, wherein the electrically conductive material includes Tungsten (W).

* * * * *